(12) United States Patent
Gu et al.

(10) Patent No.: US 9,331,045 B2
(45) Date of Patent: May 3, 2016

(54) SEMICONDUCTOR DIE LAMINATING DEVICE WITH INDEPENDENT DRIVES

(75) Inventors: Wei Gu, Shanghai (CN); Zhong Lu, Shanghai (CN); Cheeman Yu, Fremont, CA (US); Chin-Tien Chiu, Taichung (TW); En-Yong Tai, Shanghai (CN); Min Ni, Shanghai (CN)

(73) Assignees: SanDisk Information Technology (Shanghai) Co., Ltd., Shanghai (CN); SanDisk Semiconductor (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/399,495

(22) PCT Filed: May 7, 2012

(86) PCT No.: PCT/CN2012/075126
§ 371 (c)(1),
(2), (4) Date: Nov. 6, 2014

(87) PCT Pub. No.: WO2013/166641
PCT Pub. Date: Nov. 4, 2013

(65) Prior Publication Data
US 2015/0115479 A1    Apr. 30, 2015

(51) Int. Cl.
*H01L 23/00* (2006.01)
*H01L 23/544* (2006.01)
(Continued)

(52) U.S. Cl.
CPC .............. *H01L 24/75* (2013.01); *H01L 21/561* (2013.01); *H01L 23/3107* (2013.01); *H01L 23/544* (2013.01); *H01L 24/49* (2013.01); *H01L 24/83* (2013.01); *H01L 24/97* (2013.01); *H01L 21/565* (2013.01); *H01L 23/3121* (2013.01); *H01L 24/48* (2013.01); *H01L 24/85* (2013.01); *H01L 25/0657* (2013.01); *H01L 2223/5442* (2013.01); *H01L 2223/54426* (2013.01); *H01L 2223/54486* (2013.01); *H01L 2224/32145* (2013.01);
(Continued)

(58) Field of Classification Search
CPC ........... H01L 2224/32225; H01L 2224/16225; H01L 2224/27; H01L 24/32; H01L 24/27; H05K 3/305; H05K 3/4635; H05K 3/32
See application file for complete search history.

(56) References Cited

U.S. PATENT DOCUMENTS

| 4,680,617 A | 7/1987 | Ross |
| 2007/0158799 A1 | 7/2007 | Chiu et al. |

(Continued)

FOREIGN PATENT DOCUMENTS

| CN | 1919598 | 2/2007 |
| CN | 101795541 | 8/2010 |

(Continued)

OTHER PUBLICATIONS

International Search Report and Written Opinion dated Feb. 14, 2013 in International Patent Application No. PCT/CN2012/075126.
(Continued)

*Primary Examiner* — Roy Potter
(74) *Attorney, Agent, or Firm* — Vierra Magen Marcus LLP

(57) ABSTRACT

A laminating device (230) and method are disclosed for laminating semiconductor die (220) on substrates on a panel (200) of substrates. The laminating device (230) includes lamination units (234,236,238,240) that operate independently of each other so that a row or column of semiconductor die (220) may be independently laminated onto a row or column of substrates simultaneously.

20 Claims, 10 Drawing Sheets

(51) Int. Cl.
 H01L 23/31 (2006.01)
 H01L 21/56 (2006.01)
 H01L 25/065 (2006.01)

(52) U.S. Cl.
 CPC ............... *H01L2224/32225* (2013.01); *H01L 2224/48091* (2013.01); *H01L 2224/48145* (2013.01); *H01L 2224/48227* (2013.01); *H01L 2224/49* (2013.01); *H01L 2224/73265* (2013.01); *H01L 2224/753* (2013.01); *H01L 2224/7598* (2013.01); *H01L 2224/75301* (2013.01); *H01L 2224/75702* (2013.01); *H01L 2224/75753* (2013.01); *H01L 2224/83132* (2013.01); *H01L 2224/83193* (2013.01); *H01L 2224/83203* (2013.01); *H01L 2224/83856* (2013.01); *H01L 2224/83862* (2013.01); *H01L 2224/97* (2013.01); *H01L 2225/0651* (2013.01); *H01L 2225/06506* (2013.01); *H01L 2225/06562* (2013.01); *H01L 2924/00014* (2013.01); *H01L 2924/12042* (2013.01); *H01L 2924/181* (2013.01)

(56) References Cited

U.S. PATENT DOCUMENTS

2007/0235848 A1 10/2007 Liao et al.
2010/0035384 A1 2/2010 Eichelberger et al.

FOREIGN PATENT DOCUMENTS

CN 101795541 A * 8/2010
JP 2007157291 6/2007
WO 9703466 1/1997

OTHER PUBLICATIONS

Office Action dated Dec. 31, 2014 in Taiwan Patent Application No. 102105666.
Response to Office Action filed Apr. 7, 2015 in Taiwan Patent Application No. 102105666.

* cited by examiner

SEMICONDUCTOR DIE LAMINATING DEVICE WITH INDEPENDENT DRIVES

BACKGROUND OF THE INVENTION

1. Field

Embodiments of the present invention relate to semiconductor devices.

2. Description of Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a stacked configuration. An edge view of a conventional semiconductor package 20 (without molding compound) is shown in prior art FIGS. 1 and 2. Typical packages include a plurality of semiconductor die 22, 24 mounted to a substrate 26. Although not shown in FIGS. 1 and 2, the semiconductor die are formed with die bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds are soldered between the die bond pads of the semiconductor die 22, 24 and the contact pads of the substrate 26 to electrically connect the semiconductor die to the substrate. The electrical leads on the substrate in turn provide an electrical path between the die and a host device. Once electrical connections between the die and substrate are made, the assembly is then typically encased in a molding compound to provide a protective package.

It is known to layer semiconductor die on top of each other either with an offset (prior art FIG. 1) or in a stacked configuration (prior art FIG. 2). In the offset configuration of FIG. 1, the die are stacked with an offset so that the bond pads of the next lower die are left exposed. The offset requires a greater footprint on the substrate, where space is at a premium. In the stacked configuration of FIG. 2, two or more semiconductor die are stacked directly on top of each other, thereby taking up less footprint on the substrate as compared to an offset configuration. However, in a stacked configuration, space must be provided between adjacent semiconductor die for the bond wires 30. In addition to the height of the bond wires 30 themselves, additional space must be left above the bond wires, as contact of the bond wires 30 of one die with the next die above may result in an electrical short. As shown in FIG. 2, it is therefore known to provide a dielectric spacer layer 34 to provide enough room for the bond wires 30 to be bonded to the die bond pad on the lower die 24.

Once die are diced from a wafer, individual die are picked and placed onto respective positions on a panel of substrates, atop a layer of uncured die-attach adhesive. Prior to die attach at a given substrate location, visual inspection is used to align the die with the respective substrate locations. If proper alignment is not detected in a given instance, or some other problem with that substrate location is identified, that substrate location is skipped and the die is placed at the next substrate. FIG. 3 is a prior art view of the first two columns of a substrate panel 40 after die 42 have been tacked onto respective substrate locations 44. As shown, one substrate location 44a has been skipped and did not receive a semiconductor die 42.

When the die are initially placed at substrate locations, the die-attach adhesive is a B-stage adhesive that is tacky to hold the die, but not yet fully cured. The die attach adhesive may be cured in a lamination process, where pressure and heat are applied to the die attach adhesive. Heat is applied to an underside of the substrate by a workstation on which the substrate panel is supported.

Pressure is applied to an upper surface of the die by a lamination head, examples of which are shown in prior art FIGS. 4 and 5. The lamination head 50 is a unitary piece including a row of lamination pads 52. The number of pads 52 in the row may match the number of substrate locations 44 in a column of substrates on panel 40. In the example shown, there are four substrate locations 44 and four lamination pads 52. For example, as shown in prior art FIG. 6, the lamination head 50 needs to be registered in a parallel relation to the work station on which the substrate panel 40 is supported. If this step is skipped or not properly performed, the lamination head may be skewed at an angle with respect to the substrate panel. Given the unitary construction of lamination head 50, when one edge of the lamination head contacts the die at one edge of the substrate panel, the opposite edge of the lamination panel may not properly contact the die at the opposite edge of the substrate panel. As such, the unitary lamination head 50 may exert too much force on the die 42 on one edge of the substrate panel 40, and not enough force on the die 42 on the opposite edge of the substrate panel 40.

Referring now to prior art FIG. 7, it may also happen for various reasons that some die 42 extend higher above the surface of panel 40 than others. For example, in FIG. 7, die 42a is higher than other die 42, and die 42b is lower. In this instance, unitary lamination head 50 will exert more force on die 42a than on other die 42, and less force on die 42b than on other die 42.

Referring now to prior art FIGS. 8 and 9, where each substrate location in a column has received a semiconductor die, the force exerted on each die by the lamination head may be controlled. For example, it may be desired to exert a force F1 of 30 N on each semiconductor die 42. Accordingly, the lamination head may exert an opposite force F2 in this example of 30 N×4=120 N. However, as noted above, it may happen that a substrate location 44a in a column did not receive a semiconductor die 42, as shown in FIG. 9. The lamination head 50 still exerts a downward force of 120 N. However, in this instance, that force is borne by only three semiconductor die 42. As such, the force F3 on each die 42 in the column undesirably increases to 120÷3=40 N.

DETAILED DESCRIPTION

Embodiments will now be described with reference to FIGS. 10 through 22, which relate to a laminating device for independently laminating a column of semiconductor die onto a substrate panel. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom" and "upper" and "lower" as may be used herein are for convenience and illustrative purposes only, and are not meant to limit the description of the invention inasmuch as the referenced item can be exchanged in position.

An embodiment of the present technology will now be explained with reference to the flowchart of FIGS. 10 and 11, and the top, edge and perspective views of FIGS. 12-through 22. FIG. 12 is a top view of a substrate panel 200 including a plurality of substrates 202. Panel 200 allows batch processing of substrates 202 into a number of semiconductor devices 262 (FIG. 22) at the same time to achieve economies of scale. The number of rows (in the x-direction along a length of the substrate panel) and columns (in the y-direction across a width of the substrate panel) of substrates 202 on the substrate panel 201 are shown by way of example only and the number of rows and/or columns of substrates 202 may vary in further embodiments.

Figure 12:
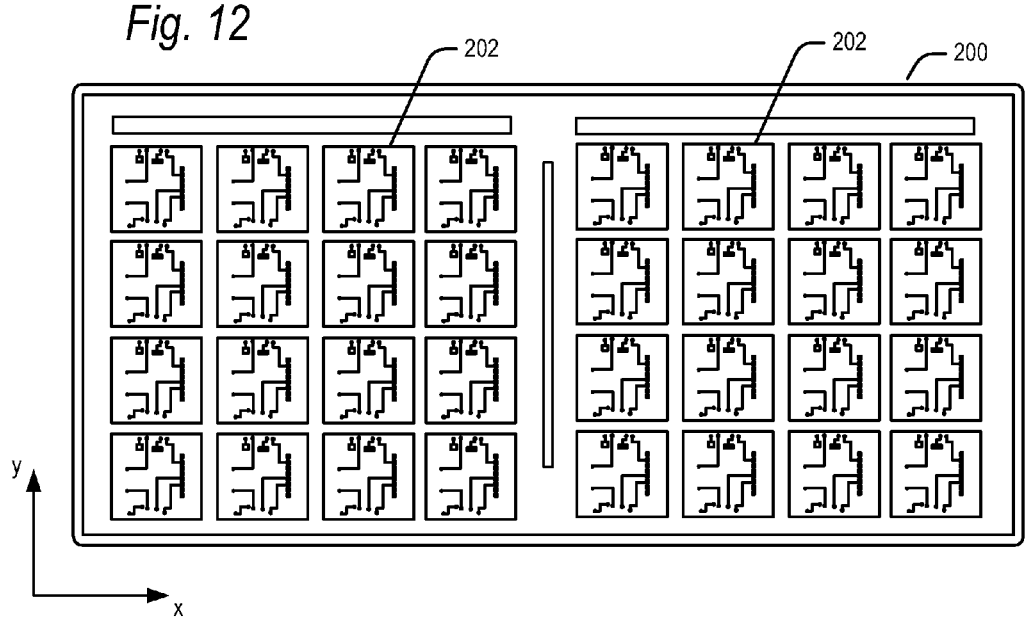
FIG. 12 is a top view of a substrate panel according to an embodiment of the present disclosure.
Figure 13:
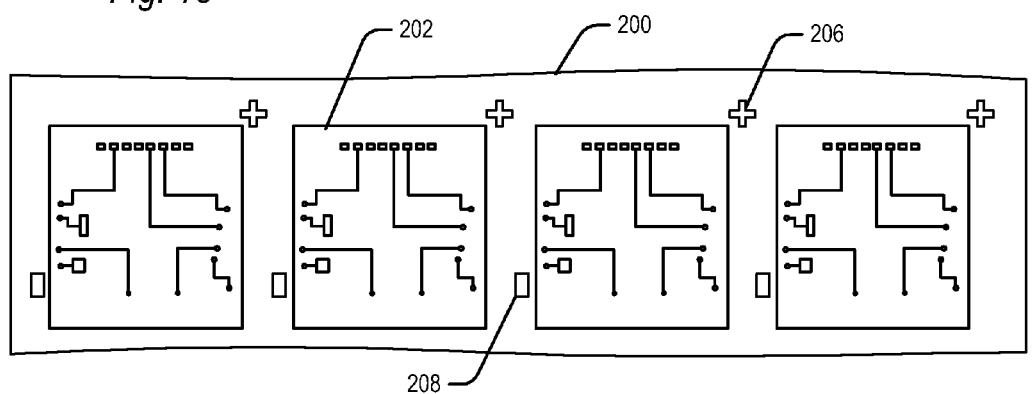
FIG. 13 is a top view of a column of substrates from the substrate panel of FIG. 12.
Figure 14:
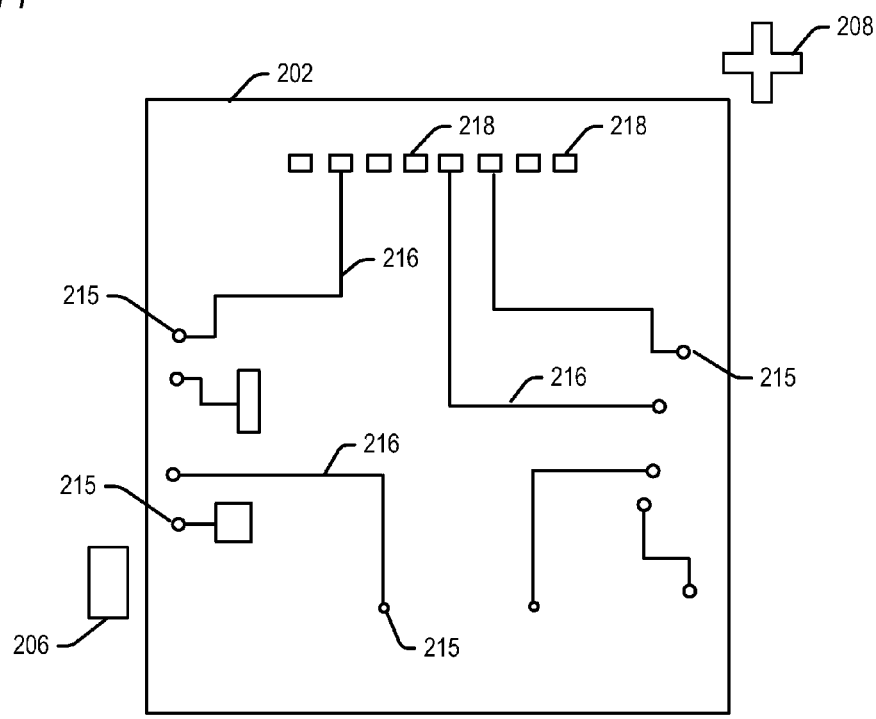
FIG. 14 is a top view of a substrate from the column of substrates of FIG. 13.

A single column of substrates 202 is shown in FIG. 13 (rotated 90° relative to FIG. 12), and an example of an individual substrate 202 is shown in top view in FIG. 14. A substrate 202 may be a variety of different chip carrier mediums, including a printed circuit board (PCB), a leadframe or a tape automated bonded (TAB) tape. Where substrate 202 is a PCB, the substrate may be formed of various conductive layers, each separated by a dielectric core. The number of layers in substrate 202 may vary in alternative embodiments.

Figure 1:
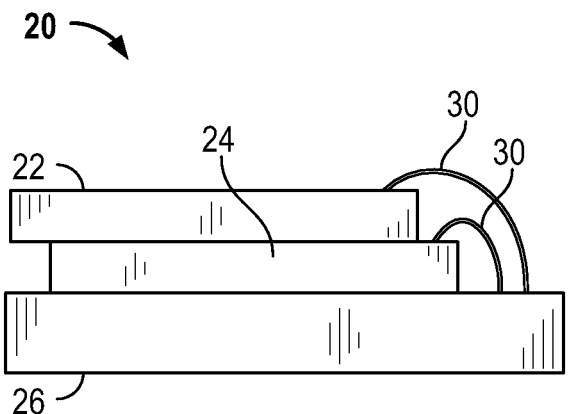
FIGS. 1 and 2 are prior art edge views of two conventional semiconductor package designs with the molding compound omitted.
Figure 2:
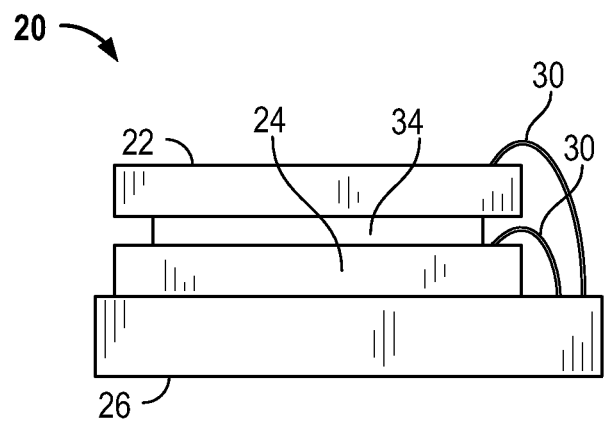
Figure 3:
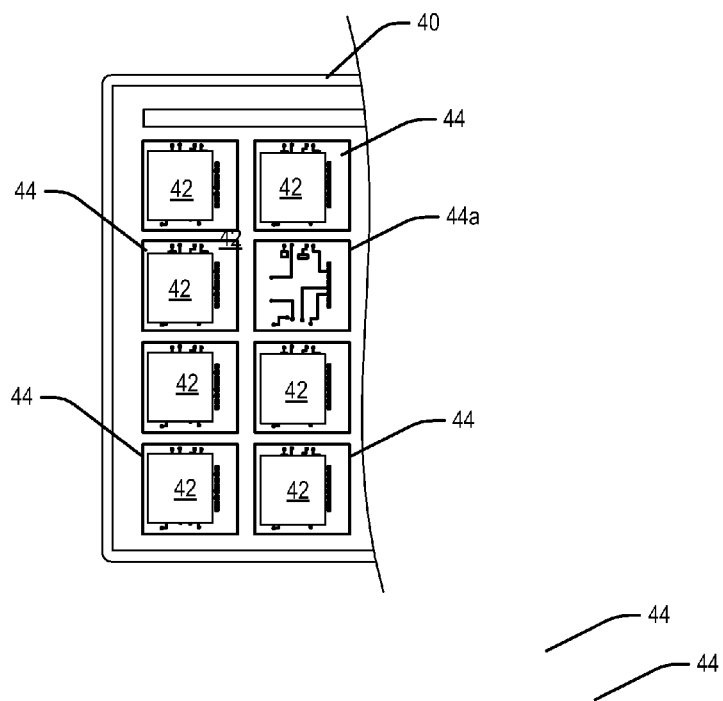
FIG. 3 is a prior art top view of a portion of a substrate panel with semiconductor die mounted to instances of substrates.
Figure 4:
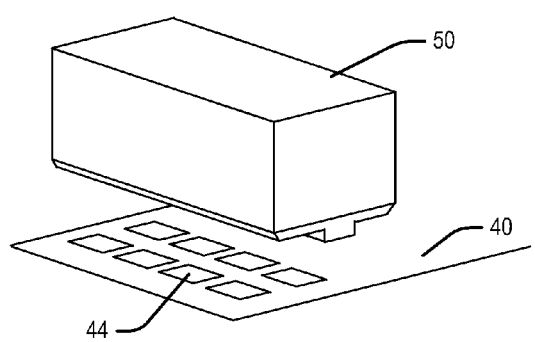
FIG. 4 is a prior art perspective view of a unitary lamination head for laminating semiconductor die to the substrate panel.
Figure 5:
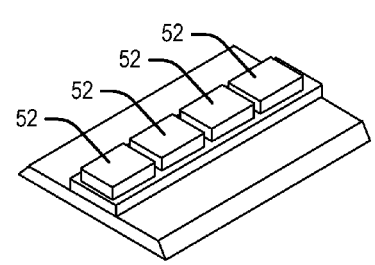
FIG. 5 is a prior art bottom view of a unitary lamination head including lamination pads.
Figure 6:
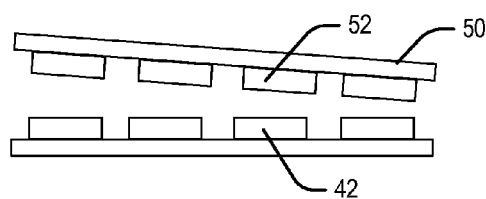
FIG. 6 is a prior art edge view of a unitary lamination head out of parallel with a substrate panel.
Figure 7:
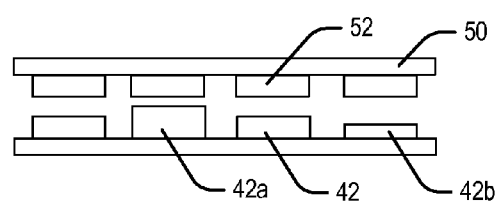
FIG. 7 is a prior art edge view of a unitary lamination head attempting to laminate die of different thicknesses to a substrate panel.
Figure 8:
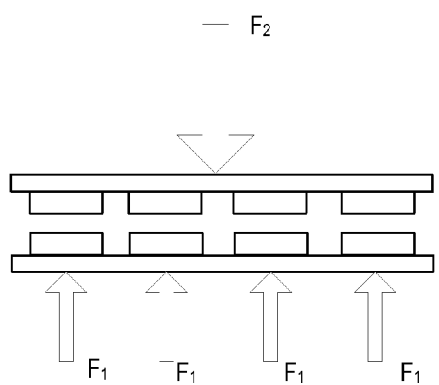
FIGS. 8 and 9 are prior art edge views of the forces applied to semiconductor die with a conventional unitary lamination head.
Figure 9:
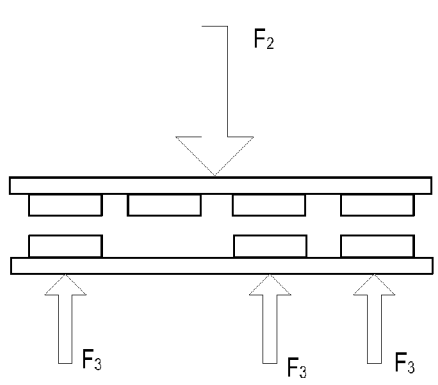
Figure 10:
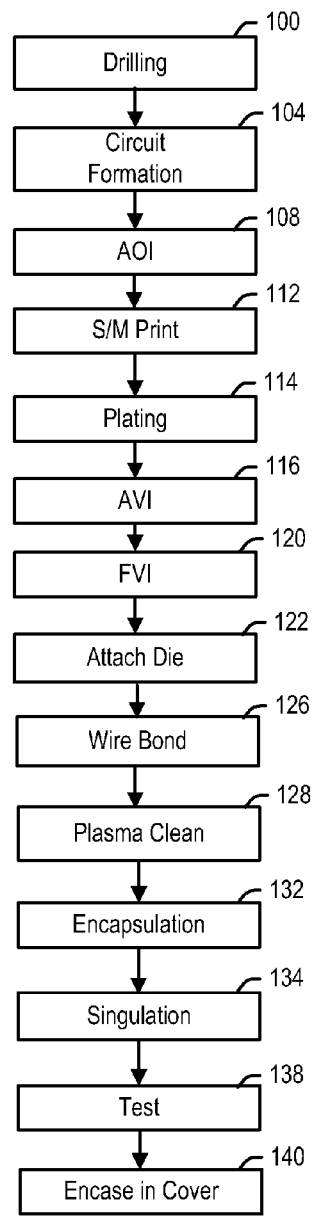
FIG. 10 is a flowchart showing the assembly of a semiconductor device according to the present disclosure.

Referring back to the flowchart of FIG. 10, in a step 100, the substrate 202 is drilled to define through-hole vias 215 in the substrate 202. The vias 215 (some of which are numbered in FIG. 14) are provided to communicate signals between different layers of the substrate 202. The number and positions of vias 215 shown are by way of example, and the substrate may include many more vias 205 than are shown in the figures, and they may be in different locations than are shown in the figures.

Conductance patterns may next be formed in one or more of the conductive layers provided on the core(s) in step 104. The conductance patterns in the top and bottom conductive layers may be formed by various methods including for example by silk screening and by photolithography. An example of a conductance pattern is shown in the top layer in FIG. 14. It is understood that one or more of the remaining conductive layers may also have conductance patterns defined therein as well.

The conductance pattern(s) in the substrate 202 may include electrical traces 216 and contact pads 218 (some of which are numbered in the figures). The traces 216 and contact pads 218 shown are by way of example, and the substrate 202 may include more traces and/or contact pads than are shown in the figures, and they may be in different arrangements than are shown in the figures. Other structures may be provided in the conductance pattern such as for example test pins for testing the operation of the semiconductor device 262.

The substrate panel 200 may further include visual inspection markings 206 and/or 208 outside of the substrate 202 outline. The shapes of the markings 206/208 are provided so that they may be identified by a visual inspection camera as explained below. However, the shapes of markings 206 and/or 208 are by way of example only, and may be other shapes in further embodiments. The use of visual inspection markings 206, 208 is explained in greater detail below.

Referring again to FIG. 10, the substrate 202 may next be inspected in an automatic optical inspection (AOI) in step 108. Once inspected, a solder mask layer may be applied to the upper and/or lower surfaces of the substrate 202 in step 112. The solder mask layer(s) are formed of a polymer that provides a protective coating for the copper traces of the conductance pattern and prevents solder from bleeding beyond the exposed contact pads and test pins, thereby preventing short circuits.

After formation of the solder mask layer, the exposed portions of the conductance pattern (including for example contact pads 218) on the top layer and bottom layer may be plated with a Ni/Au layer or the like in step 114 in a known electrolytic plating, electro-less or thin film deposition process.

In step 116, the substrate 202 may be inspected and tested in an automated inspection process, and in step 120, the substrate may undergo a final visual inspection, to check electrical operation, and for contamination, scratches and discoloration.

Assuming a substrate 202 passes inspection, one or more semiconductor die may next be attached to the top surface of the substrate 202 in a step 122. Further details of the die attach step 122 are explained with respect to the flowchart of FIG. 11, and the top, perspective and cross-sectional edge views of FIGS. 15, 16 and 17, respectively. In step 142, a layer of die attach adhesive is applied to the surface of a substrate. The die attach adhesive may be applied as a B-stage adhesive; sticky and semi-solid but not yet cured to a fully solid c-stage. An example of a die attach adhesive which may be used is made by Henkel China, having headquarters in Shanghai, P.R. China, under the brand name Ablestik.

Figure 15:
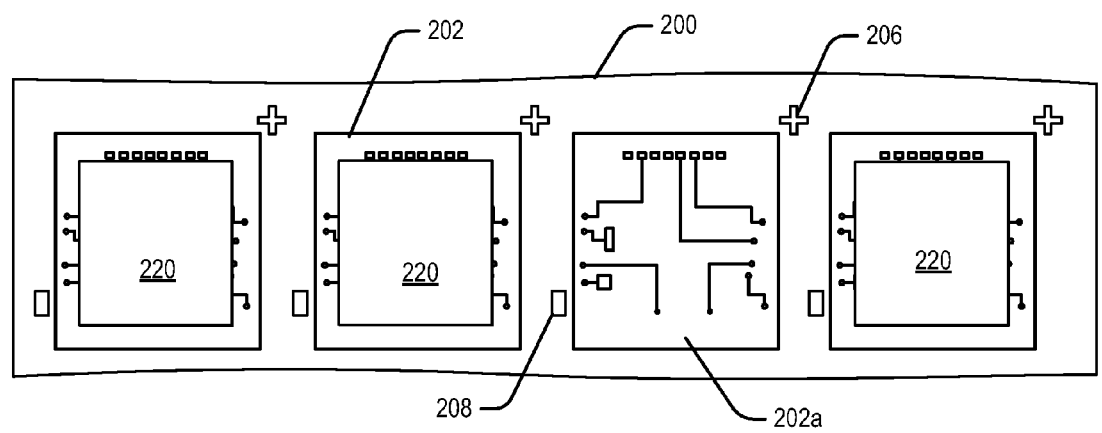
FIG. 15 is a top view of a column of substrates from the substrate panel as in FIG. 13 and further including semiconductor die.

In step 144, a pick and place robot (not shown) carries a semiconductor die 220 to the substrate panel 200, and positions it on the B-stage die attach adhesive on substrate 202 as shown in the column of substrates in FIG. 15. The pick and place robot includes one or more positioning cameras which detect the position of the visual inspection markings 206, 208 adjacent each substrate 202. This allows proper positioning of the die 220 in the x- and y-directions on the substrate.

If the visual positioning camera is unable to detect the markings 206 and/or 208, or some other problem is detected with a given instance of a substrate 202, the pick and place robot skips that instance (places no die 220 there) and moves on to the next instance of a substrate 202. Thus, in the example of FIG. 15, an instance 202a of substrate 202 did not receive a die 220, while the remaining instances in the column of substrates did receive a die 220.

After the die 220 is placed on the substrate 202, heat and pressure are applied to the die 220 and substrate 202 to cure the die attach adhesive to a C-stage solid. Once the die attach adhesive is cured to its C-stage, the die 220 is fixedly attached to the substrate 202. The substrate panel 200 is supported on a work station (not shown) including a heating element. In step 146, the substrate is heated to heat the die attach adhesive.

In conjunction with step 146, a lamination step 148 is performed, where pressure is applied to a top surface of the die to cure the adhesive while the die is pressed against the substrate. In accordance with the present technology, pressure may be applied independently to multiple instances of die and substrate simultaneously using a laminating device including independent lamination heads.

Figure 16:
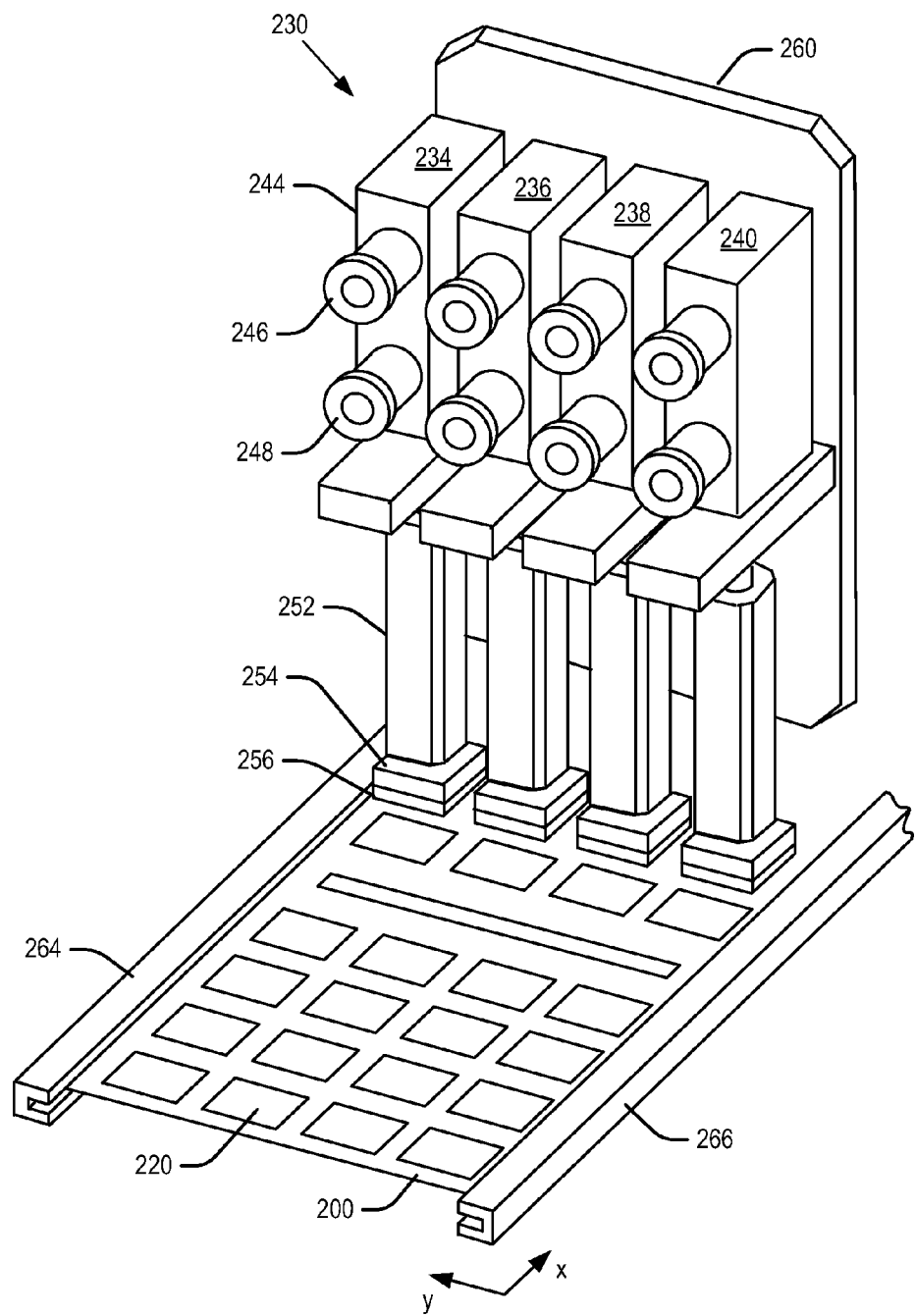
FIG. 16 is a perspective view of a laminating device for independently laminating a column of semiconductor die onto the substrate panel according to embodiments of the present disclosure.

An example of a laminating device 230 according to the present technology will now be explained with reference to FIGS. 16 through 18. FIG. 16 shows an example of a substrate panel 200 having a column of four instances of substrates 202. In this embodiment, the laminating device 230 includes four lamination units 234, 236, 238 and 240, each matching a position of each instance of the substrate 202 and die 220 in the column. It is understood that a column of substrates may include more or less than four substrates, and the laminating device 230 may include a corresponding number of more or less lamination units. In further embodiments, the number of lamination units on laminating device 230 may be less than the number of substrates 202 in a column of substrates on panel 200.

Each of the lamination units 234, 236, 238 and 240 may be identical to each other. As such, the following description of lamination unit 234 applies to each of the other lamination units in the laminating device 230. In embodiments shown, the lamination unit 234 may be driven by a pneumatic actuator. However, it is understood that other actuators may be employed for actuating portions of the lamination unit 234 to exert pressure on a top surface of a die 220. Such additional actuators include solenoids and other electromagnetic motors.

Where pneumatics are used, lamination unit 234 may include a drive cylinder 244 including an inlet port 246 and an exhaust port 248. A first hose 274 (FIG. 18) may be connected to inlet port 246, with the first hose selectively connected to a pressurized gas source 272. A second hose 276 may similarly be connected to exhaust port 248, with the second hose selectively connected to a pressurized gas source (which may be source 272 or a different source).

Figure 17:
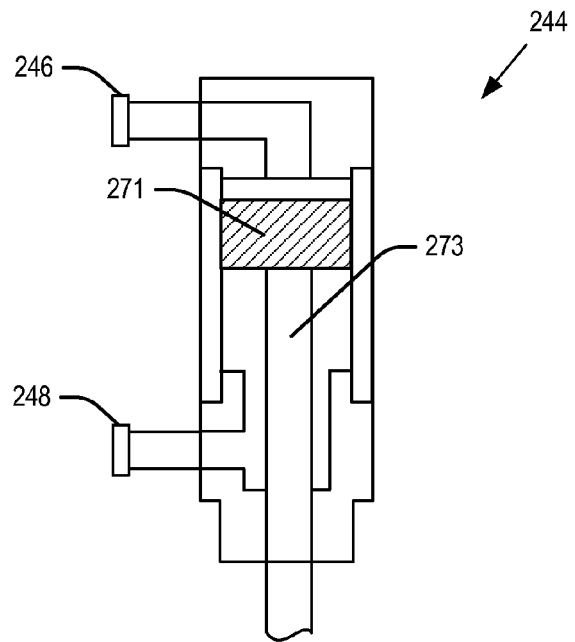
FIG. 17 is a cross-sectional view of a lamination cylinder of a lamination unit according to embodiments of the present disclosure.

FIG. 17 is a cross-sectional view of the interior of a drive cylinder 244. Pressurized gas may be supplied to inlet port 246, while exhaust port 248 is open to ambient pressure. In this event, a piston 271 is driven downward. Piston 271 is in turn connected to a drive shaft 273 which is driven downward with the piston 271. As explained below, the drive shaft 273 is connected to an arm 252 which exerts a force down on single die 220. The amount of pressurized gas provided to inlet port 246 controls the force exerted by the arm on the die 220. The downward force may be maintained for a predetermined period of time, such as for example five seconds, though the downward force may be maintained for a longer or shorter period than that in further embodiments.

After expiration of the predetermined period of time, the pressure to inlet port 246 may be opened to ambient pressure, and a pressure applied to exhaust port 248. Upon this event, the piston 271 and drive shaft 273 may move upward, removing the arm from the die 220. It is understood that drive cylinder 244 may operate using other pneumatic schemes and components in further embodiments, including for example pneumatic solenoid valves.

Referring again to FIG. 16, drive shaft 273 extends from the drive cylinder 244 and connects to an arm 252. Arm 252 terminates in a base 254 having a lamination head 256 affixed thereto. Base 254 and lamination head 256 match the footprint of a die 220 used on panel 200. As noted above, the arm 252, base 254 and lamination head 256 move downward upon application of pressurized gas to the inlet port 246 so that the lamination head 256 exerts a force down on the die 220 over which the lamination pad is positioned. In embodiments, lamination head 256 may be formed of a pliant material such as, but not limited to, rubber. The lamination head 256 may be formed of other materials in further embodiments, and in general may be broadly defined as the component that lies in direct contact with a semiconductor die to exert a force against the semiconductor die.

Each of the lamination units 234, 236, 238, 240 is mounted to a support, such as support 260. The support 260 may be mounted for translation in the x-y plane of the substrate panel in order to allow alignment of the lamination units together to a column of semiconductor die 220 on panel 200. Translation tables to which support 260 may be mounted are known for this purpose. The translation of the support 260 to align the lamination heads of each lamination unit to a column of die 220 is explained in greater detail below.

Figure 18:
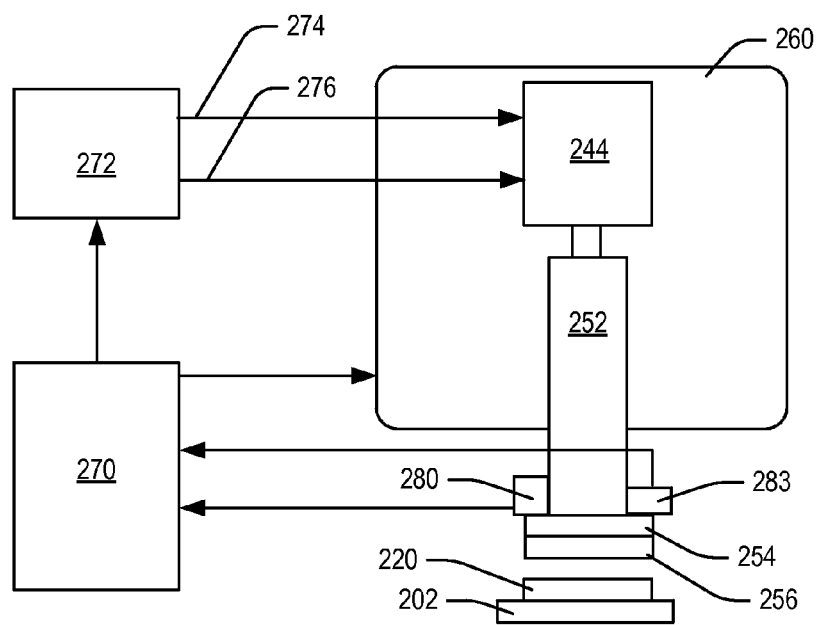
FIG. 18 is a block diagram of a controller for controlling the operation of the laminating device according to embodiments of the present disclosure.

FIG. 18 is a block diagram illustrating the operation of the lamination units 234, 236, 238, 240. A controller 270 may provide control signals and receive feedback signals for implementing a closed-loop feedback system for each of the lamination units 234, 236, 238, 240 independently of each other. The controller 270 communicates with the gas source 272 to set the pressure of the gas provided by the source 272 to the pneumatic cylinder 244 via lines 274 and 276 of each lamination unit. Each of the lamination units 234, 236, 238, 240 operates independently of each other, and the controller 270 may provide different lamination units with different pressures and/or for differing lengths of time from one or more gas sources 272.

In particular, each of the lamination units 234, 236, 238, 240 includes a pressure sensor 283 (shown schematically in FIG. 18) for sensing a pressure exerted by the lamination head 256 on a semiconductor die 220. This information may be relayed to the controller 270 several times a second (though the pressure readings may be conveyed more or less frequently than that in further embodiments).

Figure 19:
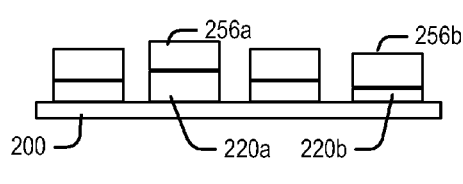
FIG. 19 is an edge view of a laminating device laminating semiconductor die of differing thicknesses onto a substrate panel according to embodiments of the present disclosure.

As noted in the prior art, it may be that some semiconductor die are thicker than others, or otherwise extend above the surface of the substrate panel higher than others. For example, FIG. 19 shows a die 220a that extends higher than another die 220b. As the lamination heads 256 on the respective lamination units lower down and exert pressure on the die in a column of die, the lamination head 256a on the higher die 220a will reach the desired target force sooner than the lamination head 256b on the lower die 220b. A target force may for example be 30 N, though the target force may be higher or lower than that in further embodiments.

The pressure sensor 280 on each lamination unit measures pressure independently of the other lamination units. Each pressure sensor 280 returns pressure readings to the controller 270, and when a given pressure sensor indicates that the target force has been reached, the controller can stop further downward movement of the lamination head for that lamination unit. Thus, in the example of FIG. 19, the lamination unit 236 with lamination head 256a may stop its downward movement prior to lamination unit 238 having lamination head 256b. In this way, the controller 270 controls the lamination units independently of each other so that each lamination head 256 provides the same target force on its associated die 220, even where the die extend above the surface of panel 200 at differing heights.

As noted above, the substrate panel may include visual inspection markings 206 and/or 208. One or more of the lamination units 234, 236, 238, 240 may further include a camera 282 (shown schematically in FIG. 18) for aligning the column of lamination units 234, 236, 238, 240 to the column of die 220 in the x-y plane of the substrate panel 200. As noted above, a support 260 may be mounted for translation in the x-y plane of the panel 200. The camera 282 may detect the position of the support 260 and lamination units 234, 236, 238, 240 relative to the visual inspection markings 206 and/or 208, and reposition the support 260 and lamination units. This allows the lamination heads 256 of each lamination unit to align together over respective die 220 in the column of die.

The spacing between die 220 in a column of die is generally fixed and known. As such, the lamination units may have their spacing fixed relative to each other, and move together on support 260, so that when one lamination head 256 is aligned over a die 220, the remaining lamination heads 256 are similarly aligned over their respective die 220. It is understood that each lamination unit 234, 236, 238, 240 may be mounted on a support 260 such that each is capable of independent x-y positioning relative to the other lamination arms in further embodiments.

While a single camera 282 is schematically shown in FIG. 18, one or more of the lamination units may include more than one camera in further embodiments to assist in the alignment of the lamination units 234, 236, 238, 240 to the visual inspection markings 206 on the substrate panel 200.

Figure 11:
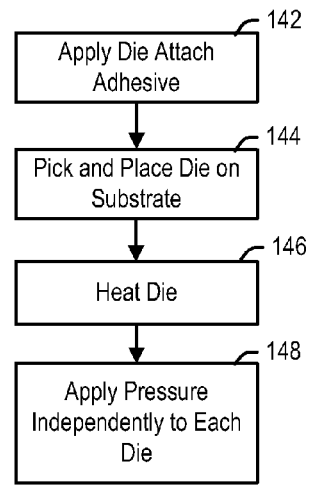
FIG. 11 is a flowchart showing more detail of the die attach step according to an embodiment of the present disclosure.

Referring again to step 148 in FIG. 11, the target pressure is applied to each of the die 220 in a column by respective lamination heads 256 for a predetermined period of time, such as for example five seconds (the time may be longer or shorter than that in further embodiments). As a target pressure may be attained more quickly on one die 220 relative to others, the pressure applied to the respective die in a column may not end all at the same time. However, once the target pressure has been applied to each of the die in the column for the predetermined period of time, the die attach adhesive between each die 220 and substrate 202 may be fully cured to a C-stage adhesive. At this point, the die attach adhesive is relatively insoluble and infusible, and the die is firmly laminated onto the substrate.

After lamination of an entire column of die on panel 200 has been completed, the panel may be advanced so that the next column of die may be positioned beneath the lamination units. The next column of die 220 is then laminated under heat and the pressure of the lamination heads as described above. As shown in FIG. 16, the substrate panel may be supported between rails 264 and 266 in a way that allows advancement of the substrate panel so that each of the columns of die 220 may be successively positioned beneath the lamination units.

While FIG. 16 shows a single row of lamination units 234, 236, 238, 240 that correspond to an entire column of die 220, it is understood that more than one row of lamination units may be provided so that multiple columns of die 220 get laminated simultaneously. Moreover, instead of having lamination units corresponding to a column of semiconductor die, the lamination units may correspond to a row of semiconductor die. In this embodiment, the lamination units may laminate a row of die 220, then translate over to the next row, and so on until all rows of panel 200 have been laminated. It is also contemplated that there may be less lamination units in a row than there are substrates in a column on panel 200. In this embodiment, the lamination units 234, 236, 238, 240 and/or substrate panel 200 would be equipped for translation in both the x- and y-directions.

As noted above, it is a feature of the laminating device 230 that respective die 220 in a column of die may be laminated onto their respective substrates independently of each other. This allows the lamination process for each die 220 in a column to be controlled at the target pressure and duration independently of each other.

Figure 20:
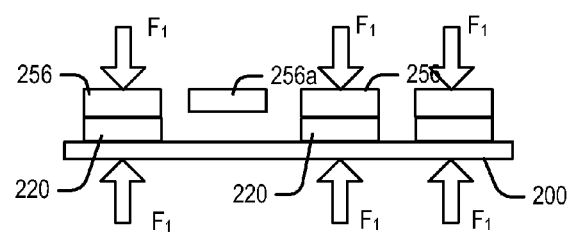
FIG. 20 is an edge view illustrating forces exerted on a column of semiconductor die by a laminating device according to embodiments of the present disclosure.

As noted above, it may happen for various reasons that one or more substrates in a column of substrates does not receive a semiconductor die. In conventional, unitary lamination heads, this results in the semiconductor die in that column bearing a greater force than intended. However, with the independently operable lamination heads of the present technology, this problem is solved. FIG. 20 illustrates an example where one of the substrates in a column did not receive a die 220. However, as each of the lamination heads 256 is independently controlled, each may apply a desired target force F1, met by an equal and opposite force F1 by the substrate 202 and die 220. In the example of FIG. 20, the lamination head 256a does not exert any forces. All die in a column may normally receive the same target force F1. However, if desired, the present technology allows different forces to be controllably applied to different die 220 in a column.

Figure 21:
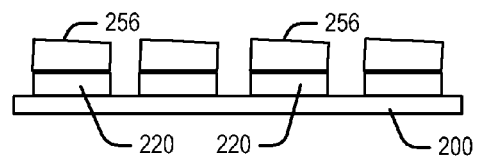
FIG. 21 is an edge view of a laminating device laminating semiconductor die onto a substrate panel according to embodiments of the present disclosure where the lamination unit is not parallel to the substrate panel.

As also noted in the Background section, a unitary lamination head generally requires a registration step where the unitary head is oriented parallel to the substrate panel. That step may be omitted using the present technology in that, even if the laminating device 230 is non-parallel, each head 256 is independently controlled. Thus, at most, a single lamination head may have a slight skew over its respective die, as shown in FIG. 21. The misalignment of one lamination head 256 does not affect the alignment of any other lamination head 256. As the lamination heads 256 are formed of a pliant material, the lamination heads may lie flat against the die 220 even in the case where a lamination unit is slightly angled with respect to a semiconductor die 220, as shown in FIG. 21.

The laminating device 230 has been described above for laminating a semiconductor die 220 onto a substrate 202. The laminating device 230 may also be used to laminate a first semiconductor die 220 onto a second semiconductor die 220, and to laminate all semiconductor die 220 to each other in a die stack. Thus, the laminating device may be used for example to laminate a single die to a substrate, two die to each other and the substrate, four die to each other and the substrate, eight die to each other and the substrate, etc. In examples, these die may be flash memory die. A controller die may further be laminated to the substrate or to the die stack using the laminating device 230. The controller die may for example be an ASIC.

After die attach and lamination as described above, the one or more semiconductor die may then be wire bonded to the substrate 202 in a step 126. In step 128, the semiconductor device 262 may undergo a plasma clean process to remove particulate and to improve the wettability of the surface to allow better flow properties of a molding compound used to protect the semiconductor die and wire bonds.

After the die 220 have been mounted and wire bonded to the substrates 202, the die 220 and wire bonds may be encapsulated in a molding compound 249 (FIG. 22) in step 132. In embodiments, the molding compound may be formed by transfer molding, or by FFT (Flow Free Thin) compression molding, using an epoxy known for example from Nitto Denko Corp. of Japan.

Figure 22:
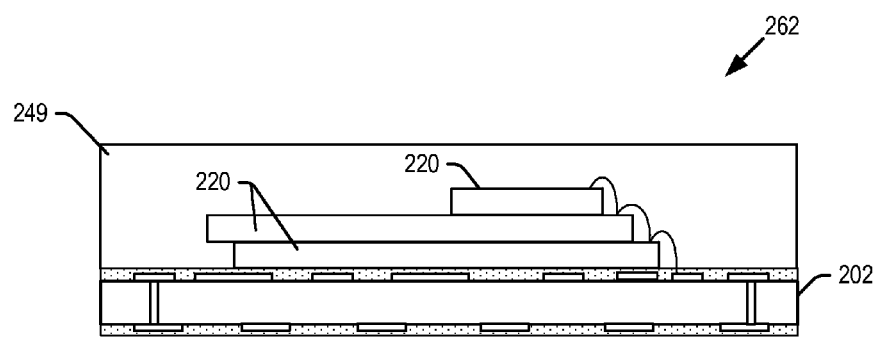
FIG. 22 is an edge view of a semiconductor device formed according to the present disclosure.

After encapsulation, the semiconductor devices 262 may be singulated from the panel 200 in step 134 to form the finished semiconductor device 262 as shown in FIG. 22. In embodiments, the device 262 may be a flash memory device, though the device 262 may be other semiconductor packages in further embodiments.

Each device 262 may be singulated by any of a variety of cutting methods including sawing, water jet cutting, laser cutting, water guided laser cutting, dry media cutting, and diamond coating wire cutting. While straight line cuts will define a generally rectangular or square shaped device 262, it is understood that device 262 may have shapes other than rectangular and square in further embodiments of the present invention.

Once cut into devices 262, the devices may be tested in a step 138 to determine whether the packages are functioning properly. As is known in the art, such testing may include electrical testing, burn in and other tests. The devices may optionally be encased within a lid in step 140.

In summary, in one embodiment, the present technology relates to a laminating device for laminating semiconductor die onto substrates on a substrate panel, the laminating device comprising: a plurality of lamination units, each lamination unit in the plurality of lamination units including an actuator and a lamination head, the actuator actuating the lamination head to exert a force on a semiconductor die, wherein the lamination heads of the plurality of lamination units are actuated independently of each other.

In another embodiment, the present technology relates to a laminating device for laminating semiconductor die onto substrates on a substrate panel, the laminating device comprising: a row of lamination units, each lamination unit in the row of lamination units including an actuator and a lamination head, the actuator actuating the lamination head to exert a predetermined force on a semiconductor die for a predetermined period of time, wherein the predetermined force and/or the predetermined time of a first lamination head against a first semiconductor die is controlled independently of the predetermined force and/or predetermined time of a second lamination head against a second semiconductor die.

In a further embodiment, the present technology relates to a panel of semiconductor devices, comprising: first, second and third instances of substrates, the first and second instances adjacent to each other along a row of substrates on the panel, and the first and third instances adjacent to each other along a column of substrates on the panel; first, second and third semiconductor die laminated onto the first, second and third instances of substrates respectively, the first semiconductor die laminated with at least one of a force and time that are independent of a force and time with which the second and third semiconductor die are laminated.

In another embodiment, the present technology relates to a semiconductor device singulated from a panel of semiconductor devices, the semiconductor device comprising: a substrate; and a semiconductor die, the semiconductor die laminated onto the substrate with a force that is controlled independently of a force with which a second semiconductor die is laminated onto a second substrate, the second semiconductor die and second substrate positioned adjacent to the substrate and semiconductor die in a row on the panel, and the semiconductor die laminated onto the substrate with a force that is controlled independently of a force with which a third semiconductor die is laminated onto a third substrate, the third semiconductor die and third substrate positioned adjacent to the substrate and semiconductor die in a column on the panel.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A laminating device for laminating semiconductor die onto substrates on a substrate panel, the substrate panel includes a plurality of rows of substrates oriented along a length of the substrate panel, and a plurality of columns oriented across the width of the substrate panel, the laminating device comprising:

a plurality of lamination units, each lamination unit in the plurality of lamination units including an actuator and a lamination head, the actuator actuating the lamination head to exert a force on a semiconductor die, wherein the lamination heads of the plurality of lamination units are actuated independently of each other, and wherein the plurality of lamination units oriented along one of a column of substrates or a row of substrates.

2. The laminating device of claim 1, further comprising a controller, the controller controlling the lamination units independently of each other.

3. The laminating device of claim 1, wherein the actuator is a pneumatic actuator.

4. The laminating device of claim 1, wherein each of the laminating heads may be controlled to exert a force on a semiconductor die, a force exerted by a first lamination head on a first semiconductor die being controlled independently of a force exerted by a second lamination head on a second semiconductor die.

5. The laminating device of claim 1, wherein each of the laminating heads may be controlled to exert a force on a semiconductor die for a predetermined period of time, a first time period during which force exerted is exerted by a first lamination head on a first semiconductor die being controlled independently of a second time period during which force exerted is exerted by a second lamination head on a second semiconductor die.

6. The laminating device of claim 1, wherein the plurality of lamination units oriented along the column of substrates.

7. The laminating device of claim 6, wherein less than all of the substrates in the column receive a semiconductor die, each lamination head in the laminating device exerting a predetermined target pressure on the semiconductor die in the column of substrates.

8. The laminating device of claim 1, wherein the plurality of lamination units oriented along the row of substrates.

9. A laminating device for laminating semiconductor die onto substrates on a substrate panel, the laminating device comprising:
a row of lamination units, each lamination unit in the row of lamination units including an actuator and a lamination head, the actuator actuating the lamination head to exert a predetermined force on a semiconductor die for a predetermined period of time, wherein the predetermined force and/or the predetermined time of a first lamination head against a first semiconductor die is controlled independently of the predetermined force and/or predetermined time of a second lamination head against a second semiconductor die; and
a pressure sensor on each lamination unit, a first pressure sensor on a first lamination unit measuring a pressure of the first lamination head on a semiconductor die independently of a second pressure sensor on a second lamination unit.

10. The laminating device of claim 9, wherein the substrate panel includes visual inspection markings, the row of lamination units including at least one camera for identifying the visual inspection markings to position the row of lamination units to a plurality of semiconductor die.

11. The laminating device of claim 9, wherein the row of lamination units are mounted to translate parallel to an x-y plane of the substrate panel.

12. The laminating device of claim 11, wherein the row of lamination units are mounted to translate together.

13. A panel of semiconductor devices, comprising:
first, second and third instances of substrates, the first and second instances adjacent to each other along a row of substrates on the panel, and the first and third instances adjacent to each other along a column of substrates on the panel;
first, second and third semiconductor die laminated onto the first, second and third instances of substrates respectively, the first semiconductor die laminated with at least one of a force and time that are independent of a force and time with which the second and third semiconductor die are laminated.

14. The laminating device of claim 13, wherein the first, second and third semiconductor die are electrically coupled to the first, second and third instances of substrates by wire bonds.

15. The laminating device of claim 13, wherein the first, second and third semiconductor die are encapsulated on the panel with a molding compound.

16. A semiconductor device singulated from a panel of semiconductor devices, the semiconductor device comprising:
a substrate; and
a semiconductor die, the semiconductor die laminated onto the substrate with a force that is controlled independently of a force with which a second semiconductor die is laminated onto a second substrate, the second semiconductor die and second substrate positioned adjacent to the substrate and semiconductor die in a row on the panel, and the semiconductor die laminated onto the substrate with a force that is controlled independently of a force with which a third semiconductor die is laminated onto a third substrate, the third semiconductor die and third substrate positioned adjacent to the substrate and semiconductor die in a column on the panel.

17. The laminating device of claim 16, wherein the semiconductor die is electrically coupled to the substrates by wire bonds.

18. The laminating device of claim 16, wherein the semiconductor die is encapsulated on the substrate with a molding compound.

19. The laminating device of claim 16, wherein the semiconductor device is a flash memory device.

20. A laminating device for laminating semiconductor die onto substrates on a substrate panel, the laminating device comprising:
a row of lamination units, each lamination unit in the row of lamination units including an actuator and a lamination head, the actuator actuating the lamination head to exert a predetermined force on a semiconductor die for a predetermined period of time, wherein the predetermined force and/or the predetermined time of a first lamination head against a first semiconductor die is controlled independently of the predetermined force and/or predetermined time of a second lamination head against a second semiconductor die;
wherein the row of lamination units are mounted to translate together, parallel to an x-y plane of the substrate panel.

* * * * *